(12) United States Patent
Kida et al.

(10) Patent No.: US 7,503,980 B2
(45) Date of Patent: Mar. 17, 2009

(54) SUBSTRATE SUPPORTING APPARATUS

(75) Inventors: Naoya Kida, Yokohama (JP); Toshihiro Tachikawa, Yokohama (JP); Jun Futakuchiya, Yokohama (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 11/642,155

(22) Filed: Dec. 20, 2006

(65) Prior Publication Data
US 2007/0157466 A1 Jul. 12, 2007

(30) Foreign Application Priority Data
Dec. 27, 2005 (JP) ............... 2005-376558

(51) Int. Cl.
H01L 21/00 (2006.01)
C23C 14/00 (2006.01)
C23C 16/00 (2006.01)

(52) U.S. Cl. ............... 118/728; 118/724; 118/725; 118/500; 156/345.51; 156/345.52; 156/345.53; 156/345.54

(58) Field of Classification Search ........... 118/728, 118/500; 156/345.51, 500
See application file for complete search history.

(56) References Cited

U.S. PATENT DOCUMENTS

| | | | | |
|---|---|---|---|---|
| 848,776 | A * | 4/1907 | Sisson | ............ 384/528 |
| 2,998,635 | A * | 9/1961 | Burritt, Jr. et al. | ...... 29/898.065 |
| 5,075,256 | A | 12/1991 | Wang et al. | |
| 5,358,337 | A * | 10/1994 | Codatto | ............ 384/41 |
| 6,343,183 | B1 * | 1/2002 | Halpin et al. | ............ 392/416 |
| 2005/0022746 | A1 * | 2/2005 | Lampe et al. | ............ 118/728 |
| 2006/0130767 | A1 * | 6/2006 | Herchen | ............ 118/728 |

FOREIGN PATENT DOCUMENTS

| | | | |
|---|---|---|---|
| JP | 2000183146 A | * | 6/2000 |
| JP | 2001-508599 A | | 6/2001 |
| JP | 3784253 B2 | | 3/2006 |
| WO | WO 98/32893 A3 | | 7/1998 |

* cited by examiner

*Primary Examiner*—Ram N. Kackar
(74) *Attorney, Agent, or Firm*—Frishauf, Holtz, Goodman & Chick, P.C.

(57) ABSTRACT

A substrate supporting apparatus includes a plate member of an aluminum alloy having a flat upper surface, bottomed pits formed in the plate member, and spacer members held in the pits, individually. The spacer members are sapphire spheres. The diameter of each spacer member is a little smaller than that of each pit. The upper end of each spacer member projects from the upper surface of the plate member. A spot facing is formed in a region that includes the open edge portion of the pit. A bending portion which is obtained by plastically deforming the open edge portion of the pit toward the spacer member is formed on a bottom surface of the spot facing. A V-shaped groove is formed behind the bending portion.

3 Claims, 6 Drawing Sheets

SUBSTRATE SUPPORTING APPARATUS

CROSS-REFERENCE TO RELATED APPLICATIONS

This application is based upon and claims the benefit of priority from prior Japanese Patent Application No. 2005-376558, filed Dec. 27, 2005, the entire contents of which are incorporated herein by reference.

BACKGROUND OF THE INVENTION

1. Field of the Invention

The present invention relates to a substrate supporting apparatus used in an apparatus for processing, for example, a semiconductor wafer or the like and a manufacturing method therefor.

2. Description of the Related Art

In semiconductor manufacturing processes, a substrate supporting apparatus that has a heating function and the like is used to process a substrate, such as a wafer. The substrate supporting apparatus has a plate member for supporting the substrate. The substrate is placed on the upper surface of the plate member.

If any particulate dust, a contributor to contamination, exists on the plate member and adheres to the reverse side of the wafer, it lowers the quality of semiconductors. To prevent adhesion of the particulate dust, therefore, an attempt is made to arrange a plurality of small spacer members on the upper surface of the plate member and place the wafer on the spacer members. Described in FIGS. 2a and 2b of Japanese Patent Publication No. 2001-508599, for example, are a plate member and a plurality of small spacer members that are arranged on the upper surface of the plate member.

Each of the spacer members is in the form of a sphere or column, which is fitted into a pit in the plate member by press fit or some other technique. The spacer members are formed of a ceramic or another material that has brittleness and a thermal expansion coefficient lower than that of metal. Possibly, on the other hand, the plate member may be formed of an aluminum alloy or other material that has a high thermal expansion coefficient.

In some cases, the plate member and the spacer members may be considerably different in thermal expansion coefficient. If the substrate supporting apparatus is exposed to high temperature in, for example, a wafer treatment process, in such cases, the spacer members, which are lower in thermal expansion coefficient than the plate member, may possibly slip out of their corresponding pits of the plate member. The spacer members can be made less easy to slip out of the pits by only being brought tightly into contact with the respective inner surfaces of the pits. If this is done, however, the plate member thermally contracts to a higher degree than the spacer members do when the substrate supporting apparatus is cooled, for example. Accordingly, an excessive stress is generated in the spacer members and may possibly break the spacer members that are brittle. Thus, the conventional substrate supporting apparatus has a problem in structural solidity to resist a heat cycle or the like.

In the conventional substrate supporting apparatus, moreover, the upper end of each spacer member simply projects from the upper surface of the plate member. If any particulate dust that causes contamination exists on the upper surface of the plate member, in this arrangement, it moves from the upper surface of the plate member toward the spacer member and may possibly adhere to the reverse side of the wafer.

BRIEF SUMMARY OF THE INVENTION

An object of the present invention is to provide a substrate supporting apparatus, capable of preventing slipping-off or breakage of spacer members and also supporting a substrate in a cleaner state.

A substrate supporting apparatus according to the invention comprises a metallic plate member having a flat upper surface, a pit formed in each of a plurality of portions of the upper surface of the plate member and having a circular open edge portion and a bottom, a spacer member which has a diameter smaller than an inside diameter of the pit, is held in the pit, and has an upper end projecting from the upper surface, a bending portion which is formed by plastically deforming the open edge portion toward the spacer member so that an opening width of the open edge portion is smaller than the diameter of the spacer member, and a groove formed behind the bending portion so as to extend along a circumferential direction of the open edge portion.

According to this arrangement, there is no possibility of the spacer member slipping out of the pit, and the spacer member can be prevented from being cracked owing to a difference in thermal expansion coefficient or the like. If any particulate dust or the like that causes contamination exists on the plate member, the groove and a bump near the bending portion can restrain it from being transferred from the upper surface of the plate member onto the spacer member. Thus, a substrate can be kept cleaner when it is supported.

In a preferred aspect of the invention, the groove has a V-shaped cross section, and the groove and the bending portion are arranged individually in continuous rings covering an entire circumference of the open edge portion.

Preferably, a spot facing should be formed on that part of the upper surface of the plate member which surrounds the open edge portion, the bending portion and the groove being formed on a bottom surface of the spot facing. Further, a bump should be formed around the groove of the bottom surface of the spot facing, the bump being confined to a position lower than the upper surface of the plate member.

An example of the spacer member is a sphere of aluminum oxide (e.g., corundum such as sapphire or ruby) or a ceramic material, such as silicon carbide, alumina, aluminum nitride, or magnesia. The plate member is formed of a metallic material selected from a group of metals including aluminum, aluminum alloy, stainless steel, nickel, nickel alloy, titanium, titanium alloy, copper, copper alloy, etc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Substrate supporting apparatuses according to embodiments of the present invention will now be described with reference to FIGS. 1 to 9.

Figure 1:
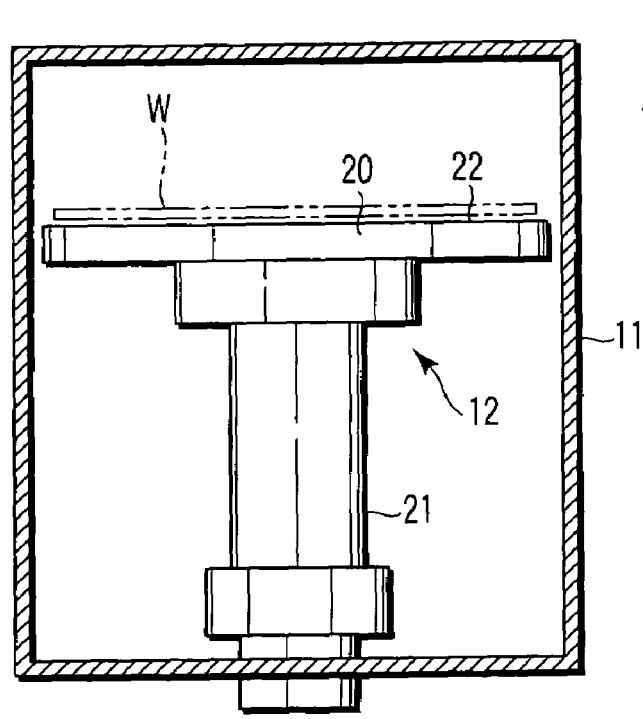
FIG. 1 is a sectional view of a wafer processor provided with a substrate supporting apparatus according to a first embodiment of the invention.

FIG. 1 shows a wafer processor 10 that is used in, for example, semiconductor manufacturing processes. The wafer processor 10 is used in processes such as chemical vapor deposition (CVD), plasma vapor deposition (PVD), etching, etc. The processor 10 comprises a sealed case 11 and a substrate supporting apparatus 12 that is arranged in the case 11.

The substrate supporting apparatus 12 includes a disc-shaped plate member 20 of a metal, such as an aluminum alloy, a post member 21 that supports the plate member 20 from the underside, and the like. The plate member 20 contains a heater unit (not shown). The heater unit heats the plate member 20 to a predetermined temperature. A substrate W, such as a wafer as an example of a supported object (workpiece), is placed on an upper surface 22 of the plate member 20.

Figure 2:
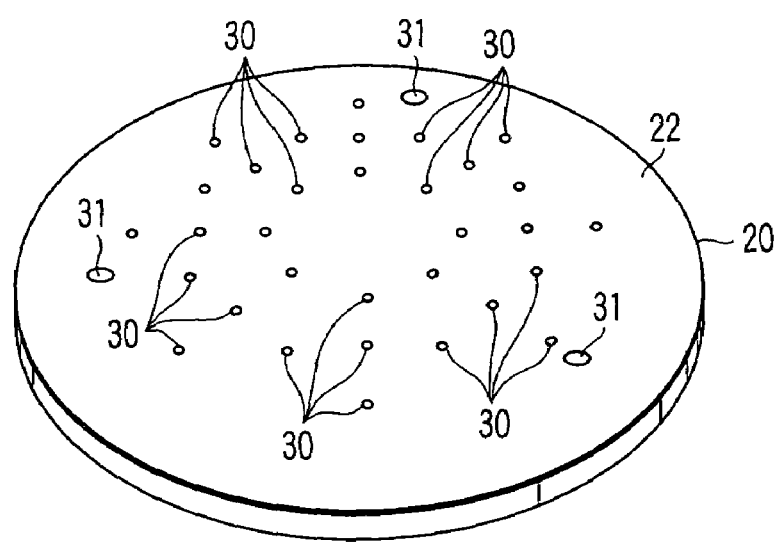
FIG. 2 is a perspective view of a plate member of the substrate supporting apparatus shown in FIG. 1.

FIG. 2 is a perspective view showing the plate member 20 from the side of the upper surface 22. The plate member 20 is circular, as viewed from above. The upper surface 22 of the plate member 20 is finished flat by machining or the like.

Spacer arrangement portions 30 of a common structure are provided in a plurality of spots of the upper surface 22 of the plate member 20, that is, in three or more spots on the plate member 20 at regular intervals in the circumferential direction thereof. Further, through-holes 31 (shown in FIG. 2) penetrate, e.g., three circumferential parts of the plate member 20 in its thickness direction. Pins (not shown) for pushing up the substrate W on the plate member 20 can be inserted individually into the through-holes 31. These pins are inserted into the through-holes 31 from under the plate member 20.

Figure 3:
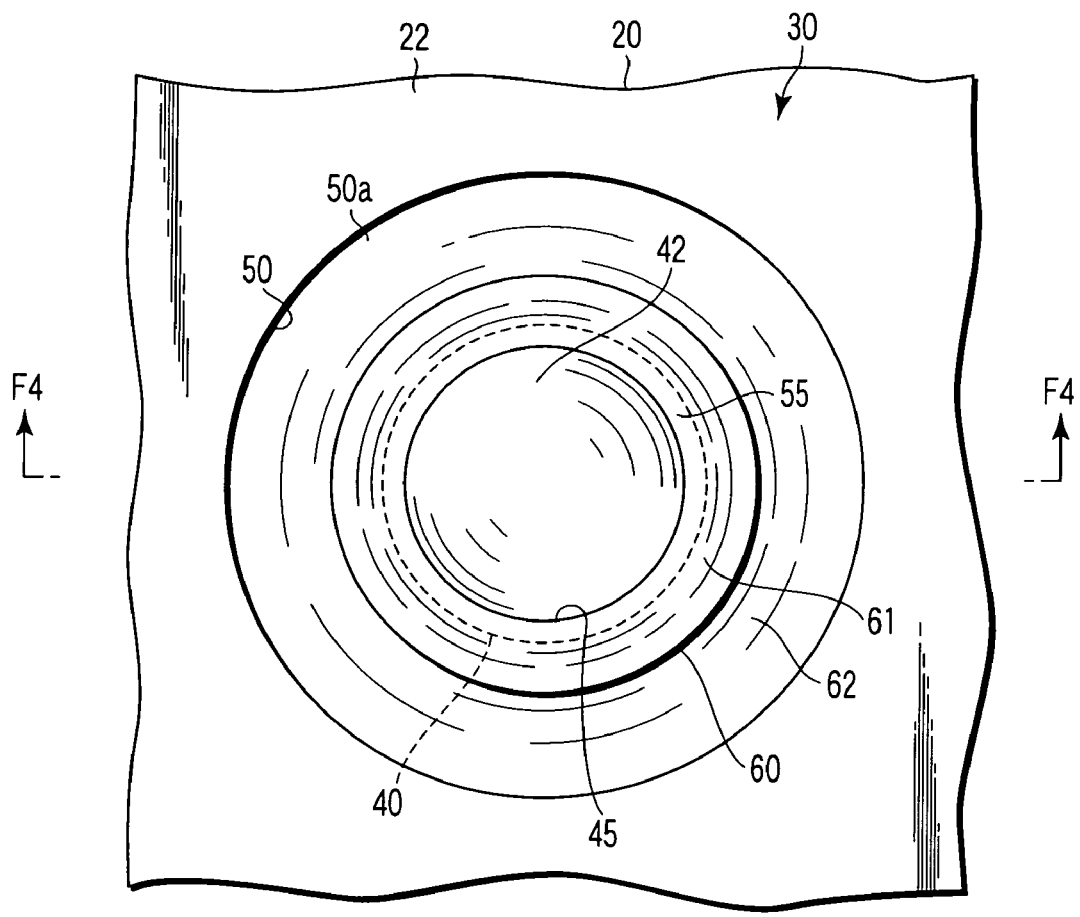
FIG. 3 is an enlarged plan view of a spacer arrangement portion of the plate member shown in FIG. 1.
Figure 4:
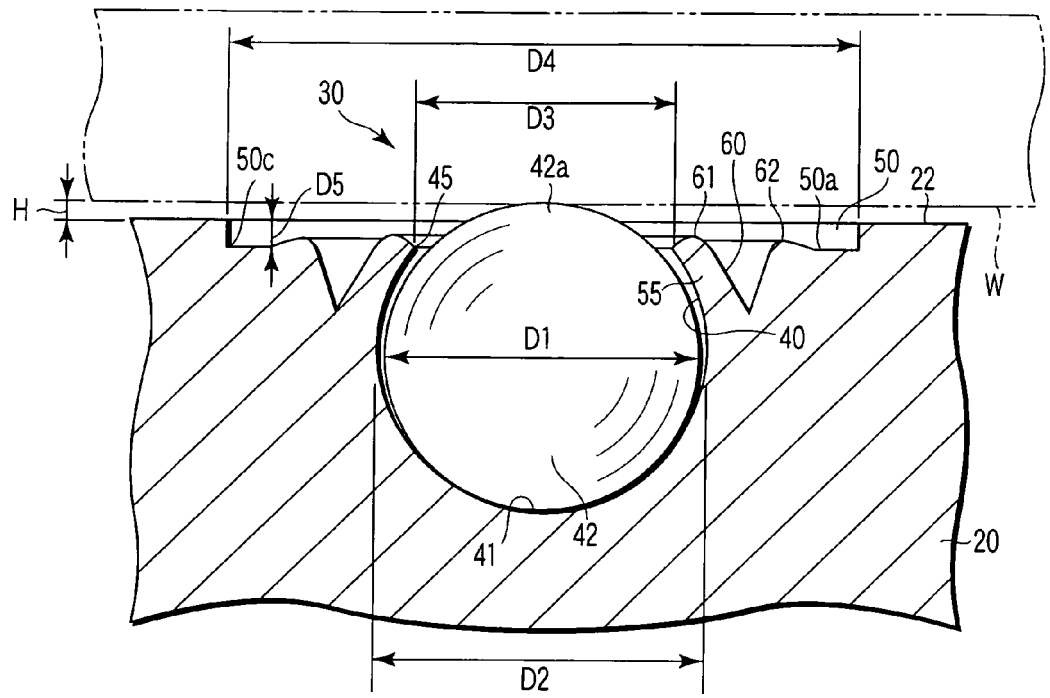
FIG. 4 is a sectional view of the spacer arrangement portion taken along line F4-F4 of FIG. 3.

FIGS. 3 and 4 show details of one of the spacer arrangement portions 30. The spacer arrangement portion 30 has a pit 40 formed in the upper surface 22 of the plate member 20 and a spacer member 42 held in the pit 40. As shown in FIG. 4, the pit 40 has a bottom 41. The top end of the pit 40 is open. The bottom 41 of the pit 40 is in the form of a hemispherical recess. An open edge portion 45 of the pit 40 is circular, as viewed from above.

An example of the spacer member 42 is a sphere of sapphire. Alternatively, the spacer member 42 may be formed of a sphere of aluminum oxide, such as ruby, or any other ceramic material. The spacer member 42 has a diameter D1 of, for example, 2 mm. A diameter D2 of the pit 40 is a little larger than the diameter D1 of the spacer member 42. For example, D2 is about 0.01 mm larger than D1.

The diameter D2 of the pit 40 is a dimension that is not smaller than the diameter D1 of the spacer member 42 even when the plate member 20 is cooled so that its amount of thermal contraction is larger than that of the spacer member 42. An upper end 42a of the spacer member 42 projects by H (shown in FIG. 4) from the upper surface 22 of the plate member 20. The projection amount H of the spacer member 42 can be accurately regulated as the bottom surface of the spacer member 42 engages the bottom 41 of the pit 40. The top of the upper end 42a of the spacer member 42 is in contact with the under surface of the substrate W.

A spot facing 50 is formed in the upper surface 22 of the plate member 20 so as to surround the open edge portion 45 of the pit 40. The spot facing 50 is a plain spot facing that has a flat bottom surface 50a and is formed by machining using, for example, an NC machine or the like. A diameter D4 of the spot facing 50 is about twice or thrice as large as the diameter D1 of the spacer member 42. For example, D4 is 2 to 3 mm larger than D1. A depth D5 of the spot facing 50 is 0.1 mm, for example.

In the bottom surface 50a of the spot facing 50, a bending portion 55 is formed on the open edge portion 45 of the pit 40. The bending portion 55 is formed by plastically deforming the open edge portion 45 toward the spacer member 42 by means of a wedgy tool 70, which will be mentioned later. An opening width D3 of the open edge portion 45 is smaller than the diameter D1 of the spacer member 42. The opening width D3 is a dimension that does not exceeds the diameter D1 of the spacer member 42 even when the plate member 20 is heated and thermally expanded to become larger than the spacer member 42.

As shown in FIG. 4, a groove 60 with a V-shaped cross section is formed in the bottom surface 50a of the spot facing 50. The groove 60 is formed along the circumferential direction of the open edge portion 45 at the back of the bending portion 55 (or on the side opposite from the spacer member 42). Bumps 61 and 62 are formed around the groove 60 of the bottom surface 50a of the spot facing 50.

The inner bump 61 is raised higher than the outer bump 62. However, the respective upper ends of the bumps 61 and 62 are lower than the upper surface 22 of the plate member 20. Therefore, the bumps 61 and 62 are confined inside the recess of the spot facing 50. As shown in FIG. 3, the bending portion 55, groove 60, and bumps 61 and 62 are arranged in continuous rings covering the entire circumference of the open edge portion 45.

The substrate supporting apparatus 12 that comprises the spacer arrangement portions 30 is manufactured by the following processes.

Figure 5:
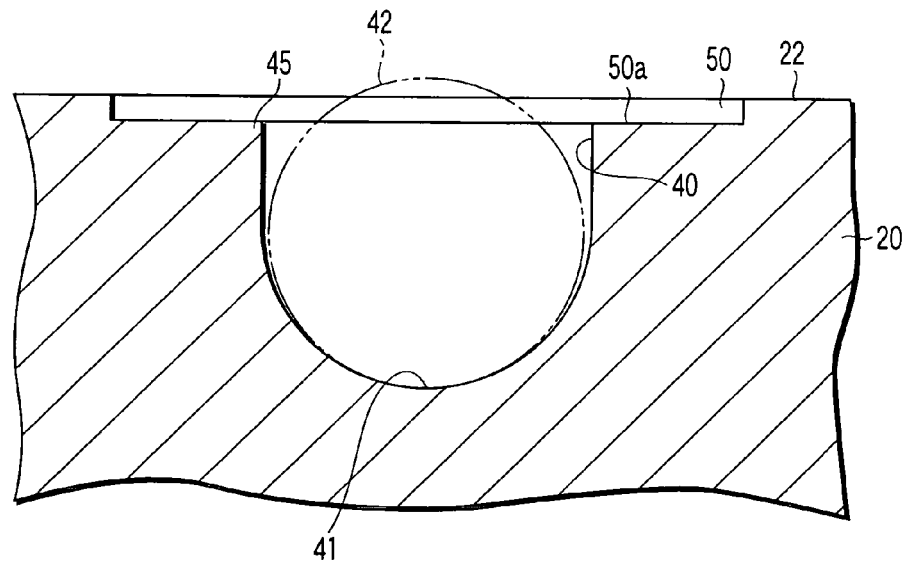
FIG. 5 is a sectional view of a part of the plate member before the formation of a bending portion of the spacer arrangement portion shown in FIG. 4.

First, the flat upper surface 22 is formed on the plate member 20 by machining. Thereafter, the pit 40 that has the bottom 41 and the spot facing 50 that has the bottom surface 50a are formed in the upper surface 22 of the plate member 20 by drilling and boring processes, as shown in FIG. 5. Then, the spacer member 42 is inserted into the pit 40.

Figure 6:
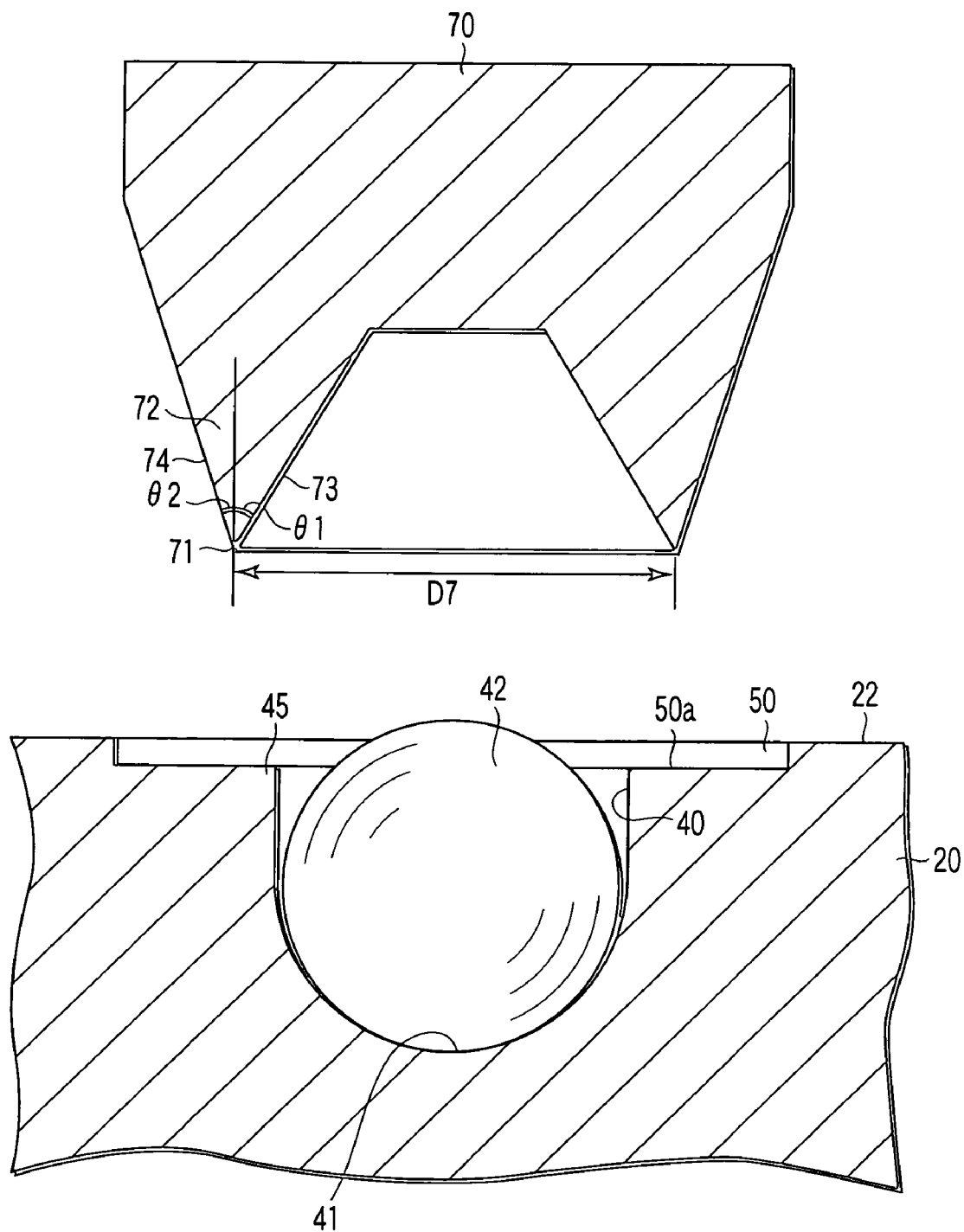
FIG. 6 is a sectional view showing the plate member, a spacer member, and a wedgy tool.

The wedgy tool 70 shown as an example in FIG. 6 is used in a bending process. It has a cylindrical edge portion 72 that has a sharp V-shaped tip 71. The tip 71 is in the shape of a ring that extends along the open edge portion 45 of the pit 40, as viewed from the distal end side of the edge portion 72. A diameter D7 of the tip 71 is larger than an inside diameter D2 (shown in FIG. 4) of the pit 40. A taper angle θ1 of an inside slope 73 of the edge portion 72 is larger than a taper angle θ2 of an outside slope 74. The taper angle θ2 of the outside slope 74 may be zero.

Figure 7:
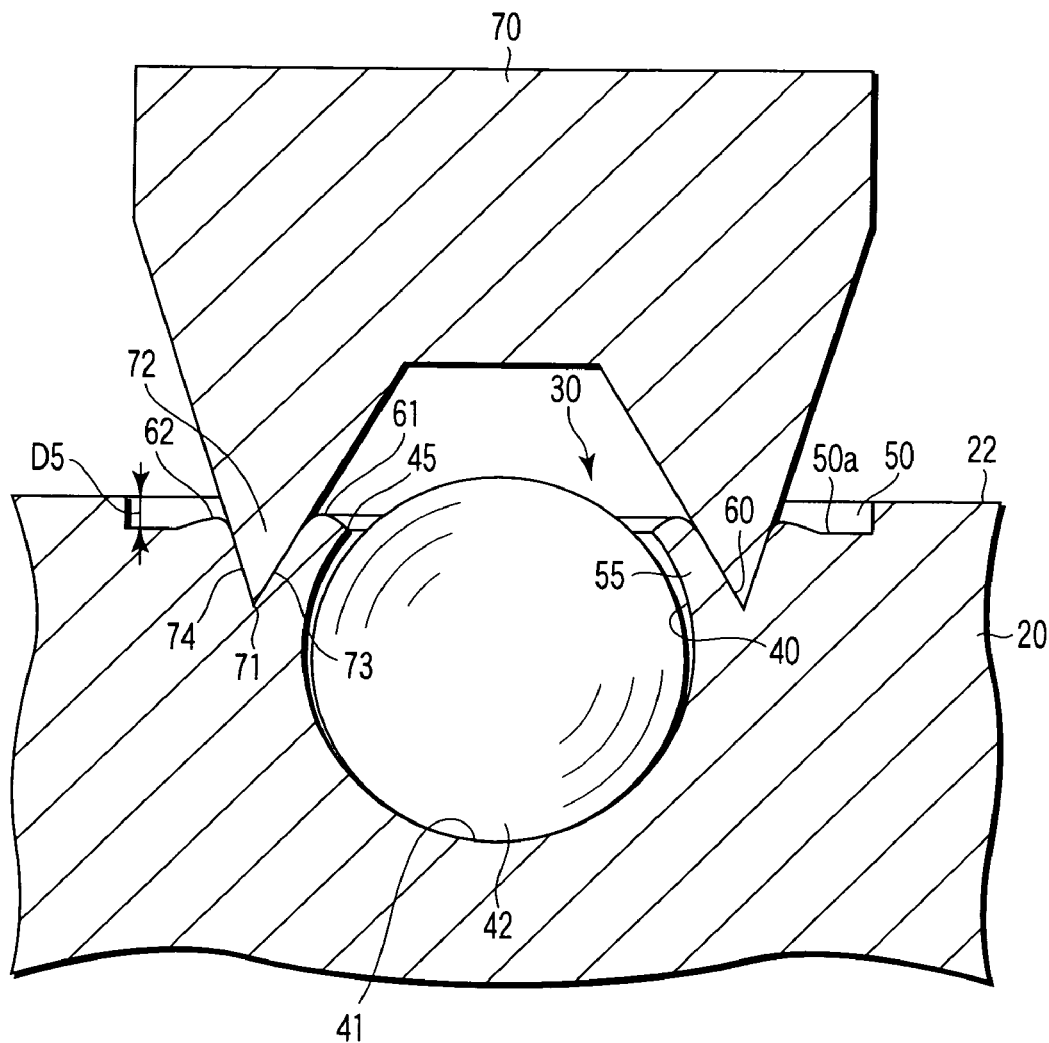
FIG. 7 is a sectional view showing a state in which the bending portion is formed on the plate member.

As shown in FIG. 7, the tip 71 of the wedgy tool 70 is pushed in around the open edge portion 45. Thus, the open edge portion 45 is plastically deformed toward the spacer member 42 so that its opening width D3 (shown in FIG. 4) is smaller than the diameter D1 of the spacer member 42.

When the tip 71 of the wedgy tool 70 is pushed in around the open edge portion 45 of the pit 40, the open edge portion 45 is pushed toward the spacer member 42 by the inside slope 73 of the edge portion 72. Thereupon, the V-shaped groove 60 is formed, and the bending portion 55 is plastically deformed so that it inclines toward the spacer member 42. Further, the inside bump 61 is formed as a part of the bottom surface 50a of the spot facing 50 swells. Furthermore, the outer bump 62 is formed as a part of the bottom surface 50a of the spot facing 50 is raised by the outside slope 74 of the edge portion 72.

Since the taper angle θ1 of the inside slope 73 of the edge portion 72 is larger than the taper angle θ2 of the outside slope 74, the inside bump 61 is raised higher than the outer bump 62. These bumps 61 and 62 cannot be raised beyond the depth D5 of the spot facing 50 and is confined inside the recess of the spot facing 50.

In the semiconductor manufacturing processes, there is a possibility of particulate dust remaining in a corner 50c (shown in FIG. 4) of the spot facing 50. The particulate dust in the corner 50c cannot be easily removed even by washing. From some cause, therefore, the particulate dust may possibly move from the bottom surface 50a of the spot facing 50 toward the spacer member 42. If the moving particulate dust reaches the upper end 42a of the spacer member 42, it may contaminate the under surface of the substrate W to be supported.

Each spacer arrangement portion 30 of the present embodiment is formed with the V-shaped groove 60 and the bumps 61 and 62 on the opposite sides of the groove 60, covering the entire circumference of the spacer member 42. Therefore, the particulate dust or the like that is urged to move from the bottom surface 50a of the spot facing 50 toward the spacer member 42 is blocked by the bumps 61 and 62. Further, the particulate dust is captured by the groove 60. Accordingly, the particulate dust or the like that causes contamination can be restrained from being transferred onto the upper end 42a of the spacer member 42, so that the substrate W can be kept cleaner when it is supported. Since the groove 60 and the bumps 61 and 62 can be simultaneously formed by the wedgy tool 70, the working process is not laborious.

Figure 8:
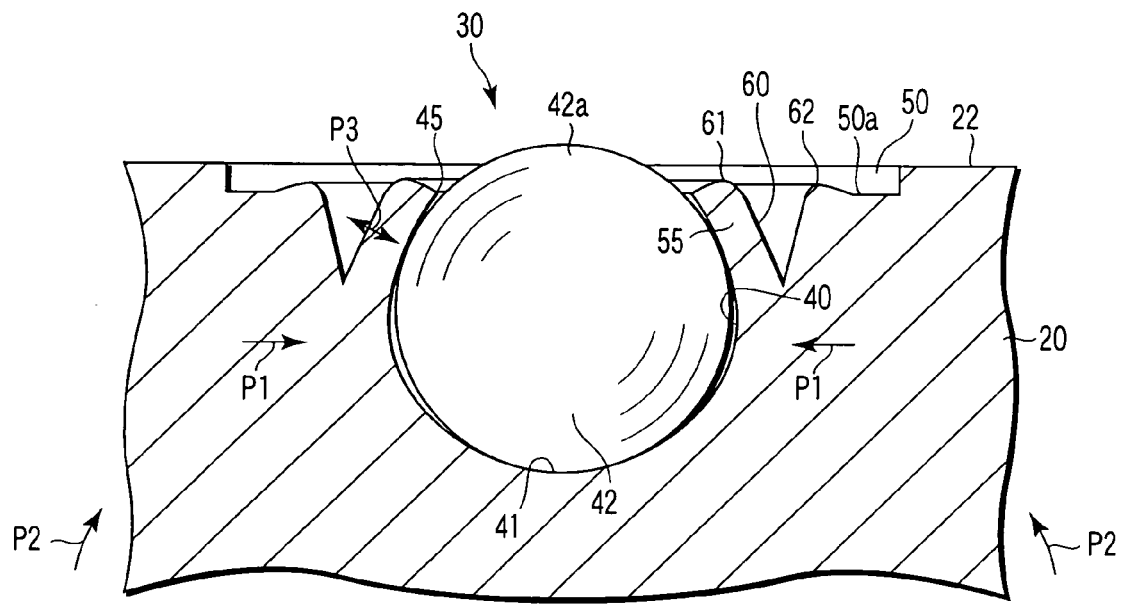
FIG. 8 is a sectional view of a spacer arrangement portion according to a second embodiment of the invention.

FIG. 8 shows a spacer arrangement portion 30 according to a second embodiment of the invention. A groove 60 of the spacer arrangement portion 30 of this embodiment is formed deeper than the groove 60 according to the first embodiment. A bending portion 55 of FIG. 8 is inclined more sharply toward the spacer member 42. Therefore, the bending portion 55 is located close to or in contact with the spacer member 42.

A plate member 20 that is formed of a metal, such as an aluminum alloy, has a thermal expansion coefficient higher than that of the spacer member 42. If the plate member 20 is contracted relatively greatly at low temperature, therefore, a compressive load P1 (shown in FIG. 8) acts on the spacer member 42. If the plate member 20 is warped in the direction of arrow P2 by thermal expansion at high temperature, moreover, the compressive load P1 may also acts on the spacer member 42.

In the spacer arrangement portion 30 of the present embodiment, the V-shaped groove 60 is formed behind the bending portion 55, and the bending portion 55 is liable to bend in the direction of arrow P3 (shown in FIG. 8). Thus, the load P1 is absorbed as the bending portion 55 bends, so that an excessive stress that can break the spacer member 42 can be avoided. This effect can be also obtained with use of the spacer arrangement portion 30 according to the first embodiment.

Figure 9:
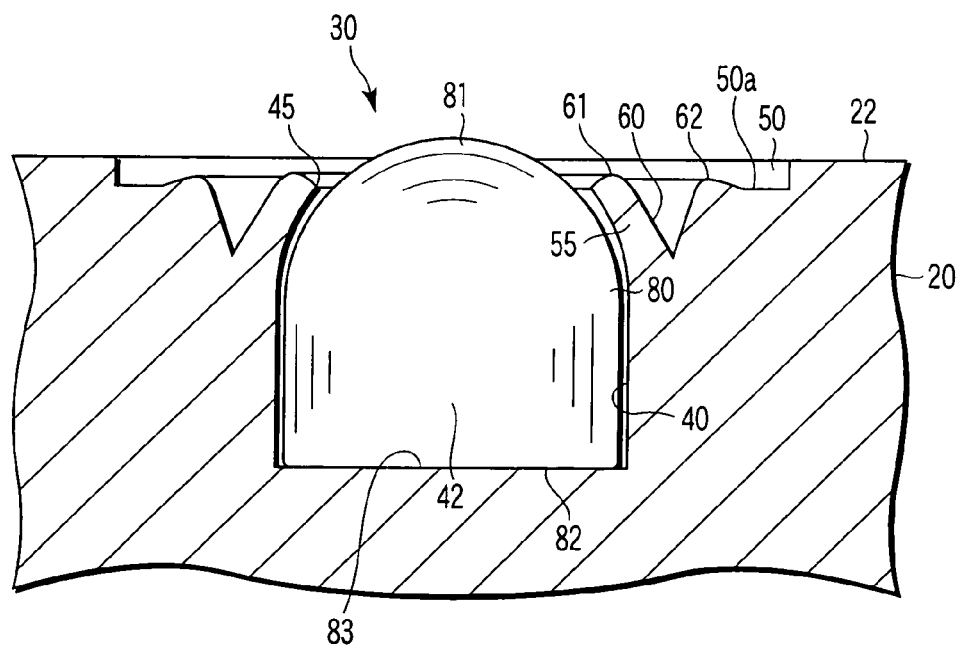
FIG. 9 is a sectional view of a spacer arrangement portion according to a third embodiment of the invention.

FIG. 9 shows a spacer arrangement portion 30 according to a third embodiment of the invention. A spacer member 42 of this embodiment has a columnar trunk portion 80, a hemispherical head portion 81, and a flat lower surface 82. A pit 40 that holds the spacer member 42 has a flat bottom 83. Since other configurations and effects of the third embodiment are the same as those of the first embodiment (FIGS. 1 to 7), common numbers are used to designate like portions of these two embodiments, and a description those portions is omitted.

The spacer member 42 is not limited to the foregoing embodiments, but may be in the shape of a rotationally symmetric body, such as a column, cone, frustum, etc. In short, the pit 40 used should only have a shape corresponding to the spacer member 42 of which the shape is properly selected as required. Further, a bending portion 55, a groove 60, and bumps 61 and 62 may be formed in a part around the pit 40.

The present invention may be also applied to a substrate supporting apparatus for supporting any other substrate than a semiconductor wafer. It is to be understood, in carrying out the present invention, that the components of the invention, including the plate member, spacer member, bending portion, and groove, may be modified suitably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate supporting apparatus comprising:
a metallic plate member having a flat upper surface; and a plurality of spacer arrangement portions provided at the upper surface of the plate member to support a substrate; wherein each of the spacer arrangement portion comprises:
a pit formed in the upper surface of the plate member and having a circular open edge portion and a bottom, wherein the open edge portion and the bottom of the pit are integrally formed with the plate member as one piece;
a spacer member which has a diameter smaller than an inside diameter of the pit, and which is held in the pit and has an upper end projecting from the upper surface of the plate member;
a bending portion which is formed by plastically deforming the open edge portion of the pit toward the spacer member so that an opening width of the open edge portion of the pit is smaller than the diameter of the spacer member, wherein the bending portion and the plate member are integrally formed as one piece; and
a groove formed in the plate member and located behind the bending portion so as to extend along a circumferential direction of the open edge portion of the pit;
wherein the groove has a V-shaped cross section, and the groove and the bending portion are arranged individually in continuous rings covering an entire circumference of the open edge portion;
wherein a spot facing is formed on a part of the upper surface of the plate member which surrounds the open edge portion of the pit, and wherein the bending portion and the groove are formed on a bottom surface of the spot facing; and wherein an inner bump and an outer bump are formed around the groove of the bottom surface of the spot facing, wherein the inner bump is raised higher than the outer bump, and wherein the bumps are confined to positions lower than the upper surface of the plate member.

2. A substrate supporting apparatus according to claim 1, wherein the spacer member is a sphere of aluminum oxide, and the plate member is formed of an aluminum alloy.

3. A substrate supporting apparatus according to claim 1, wherein the spacer member is a sphere of a ceramic material, and the plate member is formed of an aluminum alloy.

* * * * *